(12) United States Patent
Krasnov et al.

(10) Patent No.: US 9,082,914 B2
(45) Date of Patent: Jul. 14, 2015

(54) PHOTOVOLTAIC MODULE INCLUDING HIGH CONTACT ANGLE COATING ON ONE OR MORE OUTER SURFACES THEREOF, AND/OR METHODS OF MAKING THE SAME

(75) Inventors: Alexey Krasnov, Canton, MI (US); Jochen Butz, Wolfen (DE); Uwe Kriltz, Jena (DE)

(73) Assignees: Gaurdian Industries Corp., Auburn Hills, MI (US); Centre Luxembourgeois de Recherches pour le Verre et la Ceramique S.A. (C.R.V.C.), Grand Duchy de Luxembourg (LU)

( * ) Notice: Subject to any disclaimer, the term of this patent is extended or adjusted under 35 U.S.C. 154(b) by 305 days.

(21) Appl. No.: 13/349,964

(22) Filed: Jan. 13, 2012

(65) Prior Publication Data

US 2013/0180580 A1 Jul. 18, 2013

(51) Int. Cl.
*H01L 31/00* (2006.01)
*H01L 31/048* (2014.01)
*H01L 31/0392* (2006.01)

(52) U.S. Cl.
CPC ...... *H01L 31/0488* (2013.01); *H01L 31/03923* (2013.01); *H01L 31/048* (2013.01); *Y02E 10/541* (2013.01)

(58) Field of Classification Search
CPC ............ H01L 31/0216; H01L 31/02167; H01L 31/02168; H01L 31/048; H01L 31/0488; H01L 31/0522; H01L 31/0527
USPC .................................. 136/251, 259
See application file for complete search history.

(56) References Cited

U.S. PATENT DOCUMENTS

| 4,832,755 A | * | 5/1989 | Barton et al. ............ 136/251 |
| 5,650,019 A | | 7/1997 | Yamada et al. |
| 5,700,550 A | * | 12/1997 | Uyama et al. ............ 428/212 |
| 6,123,824 A | | 9/2000 | Sano et al. |

(Continued)

FOREIGN PATENT DOCUMENTS

| DE | 10 2008 007 640 | 8/2009 |
| DE | 10 2010 017 246 | 12/2011 |
| WO | WO 2007/012026 | 1/2007 |

OTHER PUBLICATIONS

J. A. Del Cueto et al., "Analysis of Leakage Currents in Photovoltaic Modules under High-Voltage Bias in the Field," Progress in Photovoltaics: Research and Applications, 2002, pp. 15-28.

(Continued)

*Primary Examiner* — Eli Mekhlin
(74) *Attorney, Agent, or Firm* — Nixon & Vanderhye P.C.

(57) ABSTRACT

Certain example embodiments of this invention relate to photovoltaic modules that include high contact angle coatings on one or more outermost major surfaces thereof, and/or associated methods. In certain example embodiments, the high contact angle coatings advantageously reduce the likelihood of electrical losses through parasitic leakage of the electrical current caused by moisture on surfaces of the photovoltaic modules, thereby potentially improving the efficiency of the photovoltaic devices. In certain example embodiments, the high contact angle coatings may be nitrides and/or oxides of or including Si, Ti, Ta, TaCr, NiCr, and/or Cr; hydrophobic DLC; and/or polymer-based coatings. The photovoltaic modules may be substrate-type modules or superstrate-type modules in different example embodiments.

5 Claims, 3 Drawing Sheets

(56) References Cited

U.S. PATENT DOCUMENTS

| | | | |
|---|---|---|---|
| 6,187,667 B1* | 2/2001 | Shan et al. | 438/636 |
| 6,277,480 B1* | 8/2001 | Veerasamy et al. | 428/217 |
| 6,288,325 B1 | 9/2001 | Jansen et al. | |
| 6,613,603 B1 | 9/2003 | Sano | |
| 6,784,361 B2 | 8/2004 | Carlson et al. | |
| 7,276,385 B1* | 10/2007 | MacKenzie et al. | 438/4 |
| 7,557,053 B2 | 7/2009 | Thomsen et al. | |
| 7,700,869 B2 | 4/2010 | Thomsen et al. | |
| 7,700,870 B2 | 4/2010 | Thomsen et al. | |
| 7,767,253 B2 | 8/2010 | Sharma | |
| 7,833,629 B2* | 11/2010 | Anderson et al. | 428/432 |
| 7,846,750 B2 | 12/2010 | Boyer et al. | |
| 7,875,945 B2 | 1/2011 | Krasnov et al. | |
| 7,888,594 B2 | 2/2011 | Lu et al. | |
| 7,893,350 B2 | 2/2011 | Thomsen et al. | |
| 7,964,788 B2 | 6/2011 | Den Boer et al. | |
| 8,012,317 B2 | 9/2011 | Lu et al. | |
| 8,022,291 B2 | 9/2011 | Thomsen et al. | |
| 8,076,571 B2 | 12/2011 | Den Boer et al. | |
| 2006/0137710 A1* | 6/2006 | Lim et al. | 134/1.1 |
| 2007/0017567 A1* | 1/2007 | Gronet et al. | 136/246 |
| 2007/0056625 A1* | 3/2007 | Higuchi et al. | 136/244 |
| 2007/0215205 A1 | 9/2007 | Thomsen et al. | |
| 2008/0145631 A1* | 6/2008 | Bhate et al. | 428/220 |
| 2009/0090412 A1* | 4/2009 | Calwer et al. | 136/259 |
| 2009/0217978 A1 | 9/2009 | Thomsen et al. | |
| 2009/0223252 A1 | 9/2009 | Fulton et al. | |
| 2010/0089444 A1* | 4/2010 | Thomsen et al. | 136/256 |
| 2010/0122728 A1 | 5/2010 | Fulton et al. | |
| 2010/0255980 A1 | 10/2010 | Fulton et al. | |
| 2010/0285167 A1* | 11/2010 | Sandhu et al. | 425/385 |
| 2011/0176236 A1 | 7/2011 | Lu et al. | |
| 2011/0259394 A1 | 10/2011 | Krasnov et al. | |
| 2011/0263066 A1 | 10/2011 | Krasnov et al. | |
| 2012/0034789 A1* | 2/2012 | Matsunaga et al. | 438/758 |

OTHER PUBLICATIONS

J. A. Del Cueto et al., "An Unlikely Combination of Experiments with a Novel High-Voltage CIGS Photovoltaic Array," National Renewable Energy Laboratory (NREL), Conference Paper 520-39877, May 2006, pp. 1-6.

Partial International Report mailed Sep. 30, 2013.

* cited by examiner

PHOTOVOLTAIC MODULE INCLUDING HIGH CONTACT ANGLE COATING ON ONE OR MORE OUTER SURFACES THEREOF, AND/OR METHODS OF MAKING THE SAME

FIELD OF THE INVENTION

Certain example embodiments of this invention relate to photovoltaic modules, and/or methods of making the same. More particularly, certain example embodiments relate to photovoltaic modules that include high contact angle coatings on one or more outermost major surfaces thereof, and/or associated methods. In certain example embodiments, the high contact angle coatings advantageously reduce the likelihood of electrical losses through parasitic leakage of the electrical current caused by moisture on surfaces of the photovoltaic modules, thereby potentially improving efficiency of the photovoltaic devices.

BACKGROUND AND SUMMARY OF EXAMPLE EMBODIMENTS OF THE INVENTION

Photovoltaic devices are known in the art (e.g., see U.S. Pat. Nos. 6,784,361, 6,288,325, 6,613,603, and 6,123,824, the disclosures of which are hereby incorporated herein by reference). Photovoltaic devices can be generally classified as being either substrate-type devices, or superstrate-type devices. Substrate-type devices generally involve thin-film device coating layers being disposed on a rigid or flexible carrier (e.g., a glass substrate) such that the thin-film device coating layers are positioned between the carrier and the sun. On the other hand, superstrate-type devices generally involve a superstrate carrier (e.g., a glass superstrate) that is positioned between the sun and thin-film device coating layers.

Aside from a substrate or superstrate, photovoltaic devices typically include a front transparent electrode, a single- or multi-layer absorber that converts solar light into electricity, and a rear electrode that is usually opaque. For substrate-type devices, an opaque back electrode oftentimes is directly disposed on the back glass (or another intervening substrate). For superstrate-type devices, the transparent front electrode oftentimes is directly disposed on the superstrate. It is noted that the term "substrate" as used below is used in a generic sense and can refer to device front substrates, device superstrates, or other supporting (e.g., glass) substrates, unless otherwise noted.

Those skilled in the art know that device efficiency helps drive acceptance and/or viability of solar solutions in the marketplace of energy (or alternative energy) solutions. Thus, there is a constant struggle to improve the efficiency of photovoltaic devices.

Unfortunately, however, photovoltaic devices do not always produce energy at their predicted efficiencies, or even at efficiencies approximating predicted levels. While some advances have been made to improve efficiencies (e.g., by providing single- or dual-axis tracking systems), further improvements are still sought after by those skilled in the art.

Thus, it will be appreciated that there is a need in the art for improved photovoltaic devices and/or methods of making the same.

As explained in greater detail below, the inventors of the instant application have noted that the moisture that accumulates on photovoltaic modules can result in the leakage of the electrical current between the electrodes through the outside of the glass.

One aspect of certain example embodiments addresses this problem by introducing a high contact angle coating to one or more outer surfaces of the photovoltaic modules. By reducing the build up of moisture, leakages can be correspondingly reduced and efficiency can be correspondingly improved and/or made more consistent.

In certain example embodiments of this invention, a photovoltaic module is provided. Front and back substantially parallel, spaced apart glass substrates are provided. A semiconductor layer is sandwiched between first and second electrode layers. The semiconductor layer and the first and second electrode layers are all located between the front and back substrates. At least one hydrophobic coating is provided on an outermost surface of the back and/or front glass substrate(s), the at least one hydrophobic coating having an initial contact angle of at least 30 degrees.

In certain example embodiments of this invention, a method of making a photovoltaic module is provided. A first substrate with a hydrophobic coating disposed thereon is provided. A second substrate is provided. Either the first substrate or the second substrate supports a plurality of photovoltaic device layers, with the photovoltaic device layers comprising a semiconductor layer sandwiched between first and second electrode layers. The first and second substrates are connected together in substantially parallel spaced apart orientation to one another such that the hydrophobic coating is on an exterior surface of the first substrate, and such that the photovoltaic device layers are located between the first and second substrates. The hydrophobic coating has an initial contact angle of at least 30 degrees.

In certain example embodiments of this invention, a coated article including a glass substrate is provided. The substrate may support a hydrophobic coating having an initial contact angle of at least 50 degrees, more preferably at least 70 degrees on a first major surface thereof. A second major surface of the substrate, opposite the first major surface, may be adapted to support or be in direct or indirect contact with a plurality of thin film layers to be used as at least a part of a solar cell.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments of this invention relate to photovoltaic modules that include high contact angle coatings on one or more outermost major surfaces thereof, with such high contact angle coatings advantageously reducing the likelihood of electrical losses through parasitic leakage of the electrical current caused by moisture on surfaces of the photovoltaic modules, thereby potentially improving efficiency of the devices. Associated methods (e.g., of making the same) also are provided in certain example embodiments of this invention.

The inventors of the instant application had previously suspected that sodium migration from the supporting substrate(s) and/or coatings might be a contributing factor to solar cell efficiency losses, e.g., by virtue of shorts being caused between the electrodes. However, after experimenting with certain silicon-inclusive barrier layers that are known to block sodium migration, it was determined that the observed shorts were not always significantly changed after the introduction of such layers. While layers comprising silicon oxynitride deposited from low-Al Si-inclusive targets did help reduce solar cell efficiency losses, other silicon-based layers that block sodium migration did not help. Thus, the inventors of the instant application surmised that the inclusion of additional or better barrier layers would not always result in significant efficiency gains and/or resolution of observable shorts, and that sodium concentration in the glass and/or coating does not significantly affect the leakage current. Differently stated, the inventors observed that some sodium blockers were effective in reducing solar cell efficiency losses while others were not, suggesting that sodium concentration in the glass and/or coatings was not the root cause of the problems with efficiency losses.

The inventors of the instant application further realized that photovoltaic modules oftentimes are deployed on rooftops, in fields, etc. It then was suspected that moisture (e.g., related to condensation) was the cause of the electrical current leakage between the electrodes through the outside of the glass, as the layers comprising silicon oxynitride (in addition to blocking sodium migration) also increased the contact angle and helped the devices shed moisture. Such leakages could result in device efficiency losses, e.g., if a long and/or efficient electrical path were formed by the condensed moisture. In a typical current device, no specific measures are taken to suppress such leakages. Thus, the realizations that Na concentration in the glass and/or the coating did not affect the leakage current, and that some other property of certain silicon-based thin film layers probably was effective in reducing the leakage current, led the inventors to recognize that the problem was related to collected moisture and that the problem could be solved by providing a high contact angle material on the substrate(s) on which moisture collects.

Figure 1:
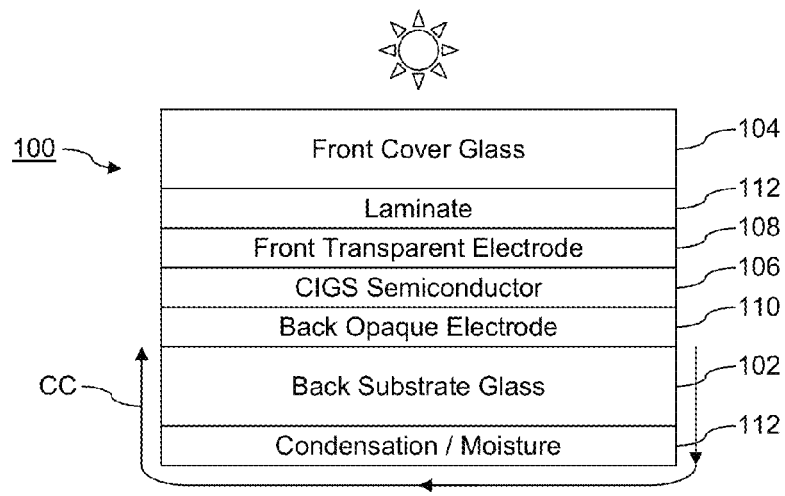
FIG. 1 is a schematic view that helps explain one reason why current leaks can occur.

FIG. 1 is a schematic view that helps explain one reason why current leaks can occur. The photovoltaic module 100 is a substrate-type photovoltaic module, as it includes a back substrate 102 that supports a plurality of thin-film device layers. More particularly, sandwiched between the back substrate 102 and a front cover glass substrate 104 is a CIGS-based semiconductor 106. The CIGS-based semiconductor 106 is sandwiched between a front transparent electrode 108 and back opaque electrode, the latter of which may be patterned in some instances. A laminate material 112 (e.g., PVB, EVA, or the like) may be used to laminate together the front cover glass 104 and the back substrate glass 102.

Condensation and/or other forms of moisture 112 can accumulate on the back substrate glass 102. The condensation has been found to generally form a continuous path on the outer surface of the back substrate glass 112, e.g., as shown in FIG. 1. This creates leakage between the front and back electrodes 108 and 110, and the arrow labeled CC in FIG. 1 represents "creep current" or surface conduction. The leakage/creep current cause(s) electrical losses that result in power losses and overall reduced efficiency of the photovoltaic device.

Once the creep current problem was identified, it was determined that one enabler of the continuous path of condensation/moisture was the low contact angle surface of the back substrate glass itself. Thus, the inventors realized that if the contact angle could be increased to a sufficiently high level, condensation and/or other forms of moisture would be less likely to form a continuous path. Rather, a high contact angle would be more likely to result in its beading into a discontinuous layer.

Certain example embodiments therefore incorporate high contact angle coatings onto one or more outer surfaces of the glass substrate. Such high contact angle coatings would be particularly advantageous for the back substrate glass of substrate-type photovoltaic modules, and the front glass of superstrate-type photovoltaic modules. In certain example instances, the coating may help suppress the parasitic leakage of electrical charges. This may be enabled by virtue of the reduced likelihood of long and/or efficient electrical paths forming which, in turn, may help reducing the likelihood of electrical shorting of the device contacts through the outside of the glass.

Figure 2:
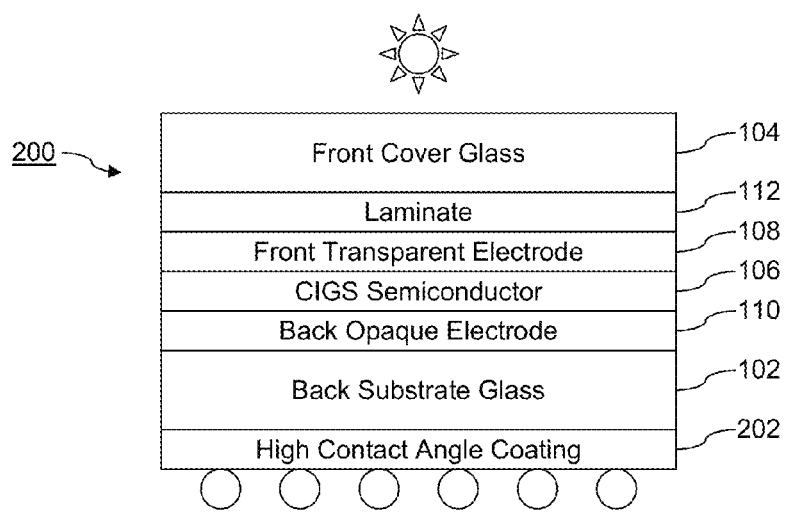
FIG. 2 is an example substrate-type photovoltaic module that incorporates a high contact angle coating in accordance with certain example embodiments.

FIG. 2 is an example substrate-type photovoltaic module that incorporates a high contact angle coating in accordance with certain example embodiments. The improved photovoltaic module 200 shown in FIG. 2 is similar to the module illustrated in FIG. 1. However, the improved photovoltaic module includes a high contact angle coating 202 on an exterior surface thereof. This high contact angle coating 202 reduces the likelihood of condensation and/or other moisture forming long and/or efficient electrical paths and, thus, reduces the likelihood of surface conduction/creep currents. As shown schematically in FIG. 2, moisture is condensed into discrete and discontinuous areas.

The high contact angle coating 202 preferably increases the contact angle from that of uncoated glass to at least about 30 degrees, more preferably at least about 50 degrees, and still more preferably at least about 70 degrees, e.g., such that the coating exhibits hydrophobic properties.

A number of different materials may be used for the high contact angle coating 202. For example, nitrides and/or oxides of or including Si, Ti, Ta, TaCr, NiCr, and/or Cr may be used in certain example embodiments. TaOxNy-inclusive coatings may be particularly desirable because it maintains its contact angle well over time. However, the process conditions in which TaOxNy may be deposited such that it is non-conductive may be narrow and may need to be controlled accordingly. Materials that include TiNx, TiOxNx and/or the like may have smaller contact angles but may be easier to form on a production level because they tend to be less conductive over a broader range of process conditions.

Other organic or inorganic materials with a suitable high contact angle may be used in other example embodiments. Hydrophobic diamond-like carbon (DLC) also may be used in certain example embodiments. See, for example, U.S. Pat. No. 6,284,377, the entire contents of which are hereby incorporated herein by reference. When DLC is used, it may be advantageous to dispose a sacrificial layer over the DLC to protect it during fabrication. The sacrificial layer may be destroyed during high temperature steps in the photovoltaic module high-temperature fabrication process.

The thickness of the layer may depend, for example, on the material chosen, its durability, etc. For the above-listed materials, a thickness of 1-500 nm generally will be sufficient, although the thickness may be higher in some instances. An example thickness of 20 nm may also be used.

In certain example embodiments, the high contact angle coating may comprise one or more thin-film layers. The layers may be formed via sputtering or any suitable coating technique. For instance, polymer-based coatings that at least temporarily increase the contact angle may be applied and/or reapplied, e.g., via a wet coating (e.g., spray, spin coating, dip, or other) technique. As noted below, even vehicle "rain-ban" type materials can surprisingly and unexpectedly help solve the problems of electrical leakage in solar cell devices. It is noted that sprayed solutions may not be practical in all instances, e.g., because of the need to reapply such solutions over time.

The optical characteristics of the high contact angle coating 202 may vary based on whether it is disposed between the device layers and the sun. A more optically transparent coating would be desirable when this is the case, as a more opaque layer would possibly interfere with the operation of the solar cell. However, this becomes less of an issue when the high contact angle coating 202 is disposed on the rear of a module.

Figure 3:
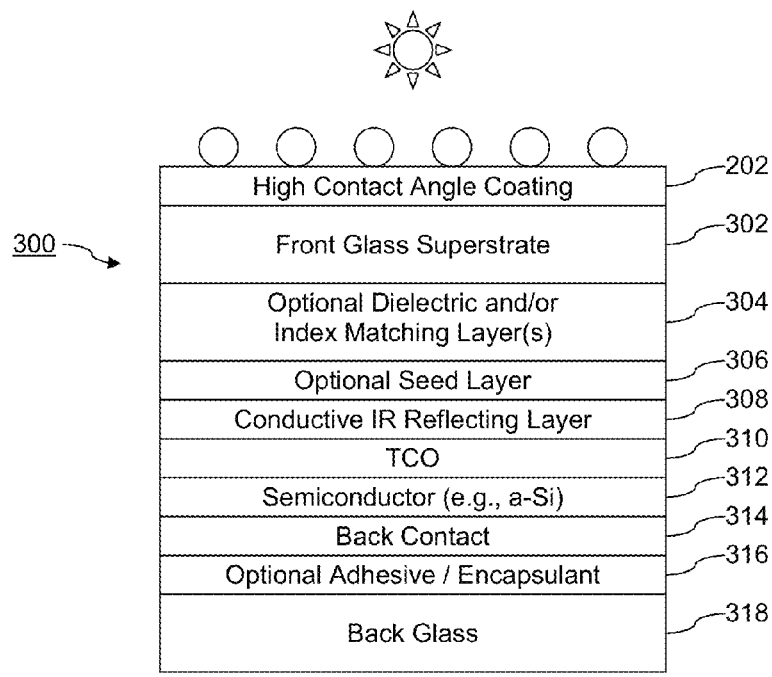
FIG. 3 is an example superstrate-type photovoltaic module that incorporates a high contact angle coating in accordance with certain example embodiments.

FIG. 3 is an example superstrate-type photovoltaic module that incorporates a high contact angle coating in accordance with certain example embodiments. The improved photovoltaic module 300 shown in FIG. 3 includes a front glass superstrate 302 that supports the high contact angle coating 202 on an exterior major surface thereof. The interior major surface of the front glass superstrate 302 supports the device layers. These may include, for example, optional dielectric and/or index match layers 304, an optional seed layer 306, and/or a conductive infrared (IR) reflecting layer 308, possibly in that order moving away from the superstrate 302. A transparent conductive oxide (TCO) 310 and a back contact 314 sandwich a semiconductor (e.g., an a-Si semiconductor) 312. An optional adhesive or encapsulant material 316 is used to laminate this structure to a back glass substrate 318.

Figure 4:
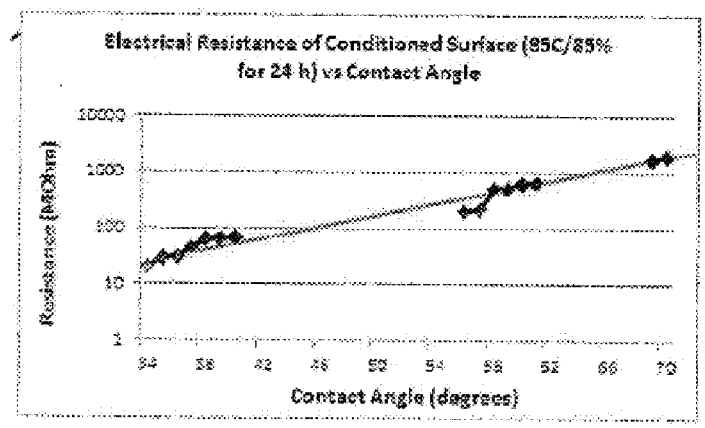
FIG. 4 is a graph that plots resistance against contact angle.

It has been determined experimentally that there is a very high degree of correlation between the contact angle of the outer surface of the back substrate glass and the creep current. This relationship is demonstrated in FIG. 4, which is a graph that plots resistance against contact angle. Contact angle is expressed in degrees, and surface resistance is expressed in MOhm. The tests were performed at 85 degrees C. and in 85% relative humidity after 24 hours. As can be seen from FIG. 4, the electrical resistance increases together with contact angle. More particularly, the increase of surface contact angle from 30 to 50 degrees has been found to increase the electrical insulation by a factor of about 10. The increase of surface contact angle from 30 to 70 degrees has been found to increase the electrical insulation by a factor of about 100. And the increase of surface contact angle from 30 to 90 degrees has been found to increase the electrical insulation by a factor of about 1000. In general, the higher the contact angle, the faster the condensed moisture will drop and/or slide off of the surface.

Another 85 degree C./85% relative humidity test was performed, where a high contact angle Makra Nanoscreen polymer (which is commercially available as a "rain-ban" coating for vehicle windshields) was applied to a photovoltaic module. The measured surface resistance was very high and supports the conclusion that the surface resistance relates to the contact angle and not to the amount of sodium.

Figure 5:
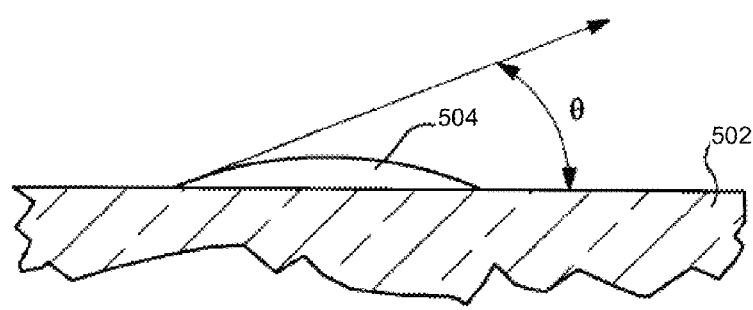
FIG. 5 is a side cross-sectional partially schematic view illustrating a low contact angle theta of a drop on an uncoated glass substrate.
Figure 6:
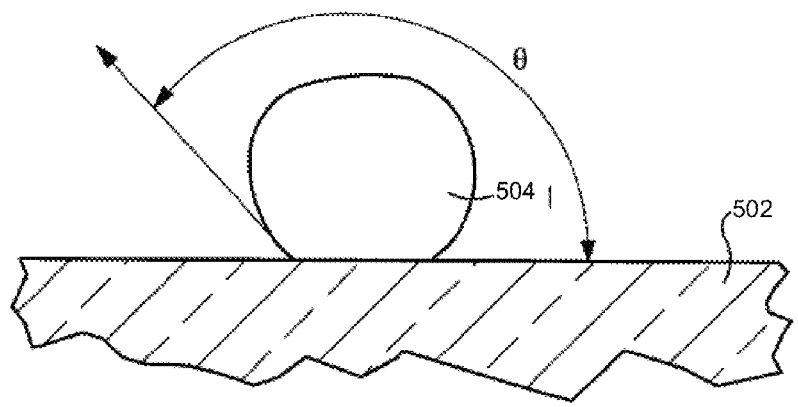
FIG. 6 is a side-cross sectional partially schematic view of the high contact angle theta that is possible when hydrophobic coatings are provided on a substrate.

In general, the contact angle is the angle at which a liquid/vapor interface meets a solid surface. To measure contact angle, a sessile drop 504 of a liquid such as water is placed on a substrate 502 as shown in FIGS. 5-6. The initial contact angle theta of a conventional glass substrate 502 with sessile water drop 504 thereon is typically from about 22-24 degrees, as illustrated in FIG. 5. Thus, conventional glass substrates are not particularly hydrophobic in nature, and it can be seen how water can condense on an uncoated substrate in a way that would produce a long and efficient electrical path. However, providing a layer 202 can cause the contact angle theta to increase to the angles discussed above, as shown in FIG. 6 for example (although layer 202 is not shown in FIG. 6 for clarity purposes), thereby improving the hydrophobic nature of the example article and, thus, the surface resistance and overall efficiency of a photovoltaic module, because of the reduced likelihood of a long and efficient electrical path being produced.

In view of the foregoing, it will be appreciated that the techniques of certain example embodiments may be used in connection with both substrate-type modules and superstrate-type modules. Moreover, the high contact angle coatings may be disposed on front and/or back major surfaces in both types of modules in different example embodiments of this invention.

Although certain example embodiments have been described in relation to CIGS and a-Si type solar cells, it will be appreciates that other materials may be used, e.g., as semiconductors. For instances, CIS, CdTe, c-Si, c-Si, mc-Si, and/or the like may be used as the semiconductors in different example embodiments of this invention. Thus, the techniques described herein may be used in connection with the solar cells described in U.S. Pat. Nos. 8,076,571; 8,022,291; 8,012,317; 7,964,788; 7,888,594; 7,875,945; 7,846,750; 7,767,253; 7,700,870; 7,700,869; and 7,557,053, as well as U.S. Publication Nos. 2011/0176236; 2011/0263066; and 2011/0259394. Each of these patent documents is hereby incorporated herein by reference in its entirety.

Example low-iron glass substrates that may be used in connection with certain example embodiments are disclosed, for example, certain of the above-identified patent documents, as well as U.S. Pat. No. 7,893,350 and U.S. Publication Nos. 2007/0215205; 2009/0217978; 2009/0223252; 2010/0122728; and 2010/0255980. The entire contents of each of these patent documents is hereby incorporated herein by reference.

In certain example embodiments, antireflective (AR) coatings may be disposed between the substrates and the high contact angle coatings. In certain example embodiments, the index of refraction of the hydrophobic coating may be taken into account such that the hydrophobic coating itself is incorporated into an AR coating that includes at least high and low index alternating layers. For instance, the hydrophobic coating may be included in a multilayer AR coating that includes a medium/high/low layer stack, a medium/high/low/high/low index layer stack, and/or the like.

In certain example embodiments, a photovoltaic module is provided. Front and back substantially parallel, spaced apart glass substrates are provided. A semiconductor layer is sandwiched between first and second electrode layers. The semiconductor layer and the first and second electrode layers are all located between the front and back substrates. At least one hydrophobic coating is provided on an outermost surface of the front and/or back glass substrate(s), the at least one hydrophobic coating having an initial contact angle of at least 30 degrees.

In certain example embodiments, a method of making a photovoltaic module is provided. A first substrate with a hydrophobic coating disposed thereon is provided. A second substrate is provided. Either the first substrate or the second substrate supports a plurality of photovoltaic device layers, with the photovoltaic device layers comprising a semiconductor layer sandwiched between first and second electrode layers. The first and second substrates are connected together in substantially parallel spaced apart orientation to one another such that the hydrophobic coating is on an exterior surface of the first substrate, and such that the photovoltaic device layers are located between the first and second substrates. The hydrophobic coating has an initial contact angle of at least 30 degrees.

In addition to the features of either of the two previous paragraphs, in certain example embodiments, the hydrophobic coating may include a layer comprising a nitride and/or oxide of or including Si, Ti, Ta, TaCr, NiCr, and/or Cr. For instance, when a layer comprising TaOxNy is selected, the layer may be non-conductive. Alternatively, in addition to the features of either of the two previous paragraphs, in certain example embodiments, the hydrophobic coating may include a layer comprising diamond-like carbon (DLC). When a layer comprising DLC is provided, a protective coating at least initially provided over the DLC may be removed, or allowed to be removed during subsequent high temperature processes, in the making of the photovoltaic module, or allowing a protective coating to be removed in certain example instances.

In addition to the features of any of the three previous paragraphs, in certain example embodiments, the hydrophobic coating is disposed on an exterior surface of the back substrate and is opaque. Alternatively, in addition to the features of any of the three previous paragraphs, in certain example embodiments, the hydrophobic coating is disposed on an exterior surface of the front substrate and is transparent.

In addition to the features of any of the four previous paragraphs, in certain example embodiments, a multilayer antireflective coating comprising is provided and includes, in order moving away from the exterior surface of the front substrate, at least a high index and a low index layer. The hydrophobic coating may be located within the multilayer AR coating at a position that corresponds to a refractive index thereof in certain example instances.

In addition to the features of any of the five previous paragraphs, in certain example embodiments, the hydrophobic coating has an initial contact angle of at least 50 degrees, more preferably at least 70 degrees.

In certain example embodiments, a coated article including a glass substrate is provided. The substrate may support a hydrophobic coating having an initial contact angle of at least 50 degrees, more preferably at least 70 degrees on a first major surface thereof. A second major surface of the substrate, opposite the first major surface, may be adapted to support or be in direct or indirect contact with a plurality of thin film layers to be used as at least a part of a solar cell. The above-described and/or other modifications and/or design options (e.g., related to contact angles, hydrophobic coating materials, solar cell type and configuration, etc.) may be made to the coated article While a layer, layer system, coating, or the like, may be said to be "on" or "supported by" a substrate, layer, layer system, coating, or the like, other layer(s) may be provided therebetween. Thus, for example, the coatings of FIGS. 2-3 may be considered "on" and "supported by" the substrate and/or other coatings even if other layer(s) are provided therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A photovoltaic module, comprising:
   front and back substantially parallel, spaced apart glass substrates;
   a semiconductor layer sandwiched between first and second electrode layers, wherein the semiconductor layer and the first and second electrode layers are all located between the front and back substrates; and
   an opaque hydrophobic coating on an outermost surface of the back glass substrate, and a transparent hydrophobic coating on an outermost surface of the front glass substrate, each of the opaque and transparent hydrophobic coatings having an initial contact angle of at least 50 degrees,
   wherein the opaque and transparent hydrophobic coatings reduce creep current between the first and second electrode layers to improve efficiency of the photovoltaic module, and
   wherein the opaque hydrophobic coating is a single continuous coating extending underneath a photoactive area of the photovoltaic module.

2. The module of claim 1, wherein the opaque hydrophobic coating includes a layer comprising a nitride and/or oxide of or including Si, Ti, Ta, TaCr, NiCr, and/or Cr.

3. The module of claim 2, wherein the opaque hydrophobic coating includes a layer comprising non-conducting TaNx or TaOxNy.

4. The module of claim 2, wherein the opaque hydrophobic coating includes a layer comprising TiNx or TiOxNy.

5. The module of claim 1, wherein the transparent hydrophobic coating includes a layer comprising diamond-like carbon.

* * * * *

UNITED STATES PATENT AND TRADEMARK OFFICE
CERTIFICATE OF CORRECTION

PATENT NO. : 9,082,914 B2  
APPLICATION NO. : 13/349964  
DATED : July 14, 2015  
INVENTOR(S) : Krasnov et al.

Page 1 of 1

It is certified that error appears in the above-identified patent and that said Letters Patent is hereby corrected as shown below:

Title page item (73) Assignees: 1$^{st}$ Assignee should be --Guardian Industries Corp.--

Signed and Sealed this  
First Day of December, 2015

Michelle K. Lee  
*Director of the United States Patent and Trademark Office*